United States Patent [19]

Tatsuta

[11] Patent Number: 5,023,676
[45] Date of Patent: Jun. 11, 1991

[54] COMPOUND SEMICONDUCTOR MESFET DEVICE WITH PASSIVATION FILM

[75] Inventor: Shigeru Tatsuta, Atsugi, Japan

[73] Assignee: Fujitsu Limited, Kawasaki, Japan

[21] Appl. No.: 387,801

[22] Filed: Aug. 1, 1989

[30] Foreign Application Priority Data

Aug. 1, 1988 [JP] Japan .............................. 63-192286

[51] Int. Cl.$^5$ ........................................... H01L 27/14
[52] U.S. Cl. ..................................... 357/22; 357/60; 357/15; 357/26
[58] Field of Search ................. 357/22 I, 22 J, 22 K, 357/60, 26, 15, 22 MD, 54, 22 S, 22 P, 22 G

[56] References Cited

U.S. PATENT DOCUMENTS

| 4,769,339 | 9/1988 | Ishii | 357/22 I |
| 4,774,200 | 9/1988 | Nakajima et al. | 357/22 I |
| 4,783,688 | 11/1988 | Shannon | 357/22 I |
| 4,791,471 | 12/1988 | Onodera et al. | 357/60 |
| 4,808,545 | 2/1989 | Balasubramanyam et al. | 357/22 I |

Primary Examiner—Mintel William
Attorney, Agent, or Firm—Staas & Halsey

[57] ABSTRACT

A metal-semiconductor field effect transistor includes a substrate of a group III-V compound having a zinc blend structure. A gate electrode is provided on the substrate so as to extend in a predetermined direction and a channel region is defined in the substrate in alignment with the gate electrode. A source region is defined in the substrate at one side of the channel region and a drain region is defined in the substrate at the other side of the channel region. A source electrode is provided on the substrate so as to cover a first part of the source region spaced from the gate electrode while leaving a second part of the source region adjacent the gate electrode uncovered, and a drain electrode is also provided on the substrate so as to cover a first part of the drain region spaced from the gate electrode while leaving a second part of the drain region adjacent the gate electrode uncovered. A passivation film of a material experiencing stress during operation is provided so as to cover the second part of the source region and the second part of the drain region. The passivation film comprises an inner area part and a marginal area part designed such that the marginal area part has a different thickness than the inner area part.

12 Claims, 7 Drawing Sheets

COMPOUND SEMICONDUCTOR MESFET DEVICE WITH PASSIVATION FILM

BACKGROUND OF THE INVENTION

The present invention generally relates to metal-semiconductor field effect transistors (MESFET) and more particularly to a compound semiconductor MESFET device constructed on a substrate of a group III-V compound semiconductor material such as gallium arsenide (GaAs), aluminium gallium arsenide (AlGaAs), indium phosphide (InP) and the like.

Integrated circuits of compound MESFET devices have characteristically high operational speeds and are used in various information processing systems such as computers, telecommunication systems, telemetry systems and the like where a particularly high operational speed is strongly demanded. Even in the systems and apparatuses using such integrated circuits, there is a persisting demand for miniaturization of the individual devices of the integrated circuit and for increased integration density so that still higher operation speeds are achieved.

Compound semiconductor MESFET devices are constructed on a group III-V compound semiconductor substrate defined with a channel region together with a source region and a drain region disposed on opposite sides of the channel region. In such devices, a gate electrode is provided directly on the substrate in correspondence to the channel region and a passivation film covers the gate electrode as well as the source and drain regions. In these structures, a complex stress field is created in the substrate in correspondence to edges of the gate electrode and the passivation film. Such stress field induces a piezoelectric charge in the substrate and the electrical charge thus induced in the channel region changes the operational speed of the device. In the description which follows, the problem of the piezoelectric effect which arises in association with the miniaturization of compound semiconductor MESFET devices will be explained with reference to FIGS. 1, 2(A) and 2(B) which illustrate a typical prior art MESFET device having a self-aligned structure.

Referring to FIG. 1, the transistor is constructed on a semi-insulating GaAs substrate 1 and comprises an n-type channel region 2 defined in the substrate 1, a gate electrode 3 provided on the substrate 1 in correspondence to the channel region 2, a source region 5 doped to the n+-type and defined in the substrate 1 at one side of the channel region 2, a drain region 6 also doped to the n+-type and defined in the substrate 1 at the other side of the channel region 2, a source electrode 8 provided on the substrate in correspondence to the source region 5 and in ohmic contact therewith, a drain electrode 9 provided on the substrate 1 in correspondence to the drain region 6 and in ohmic contact therewith, and a passivation film 7 provided so as to cover the gate electrode 3 as well as those parts of the substrate 1 extending between the gate electrode 3 and the source electrode 8 and between the gate electrode 3 and the drain electrode 9. The remainder of the substrate 1 on which the transistor is not formed is covered by a protective film 4 of silicon nitride. In the illustrated example, the gate electrode 3 is provided on the (100) surface of the GaAs substrate 1 so as to extend in the <0$\bar{1}$1> direction of the substrate.

When the passivation film 7 is formed of silicon nitride, the same is under compressional stress mainly due to the difference between the temperature at which the transistor is fabricated and the temperature at which the transistor is used. Responsive thereto, the substrate 1 experiences tensile stresses T at the inner edges 7a of the passivation film 7 as well as tensile stresses T' at the outer edges 7b of the passivation film 7 as illustrated in FIG. 2(A). For clarity, the source electrode and the drain electrode are omitted in FIG. 2(A). Further, the gate electrode 3 itself induces tensile stresses t at the inner edges 7a which tend to stretch the substrate. Since the tensile stresses T act from both sides of the gate electrode 3 in a direction to compress a region beneath the gate electrode 3, and since the magnitude of the tensile stresses T is generally much larger than that of the stresses t, compressive stress components ΔT are created in a region C of the substrate which is slightly below the gate electrode 3 as a result of the superimposition of stress components T and stress components t. Further, a tensile stress component is created in the region C as a result of the effect of the stresses T' at the outer edges 7b of the passivation film 7 acting to stretch the substrate in the region C. Such tensile stress component is usually negligible as long as the transistor has a relatively large size and there is a relatively large distance between the region C and the edges 7b. Thus, the predominant stress in the region C in this prior art MESFET device is compressive.

When a group III-V compound substrate having a zinc blend structure is subjected to such a compressive stress field acting in the <011> direction which is perpendicular to the elongating direction of the gate electrode 3 extending in the <0$\bar{1}$1 direction, a displacement of the negatively charged arsenic atoms relative to the positively charged gallium atoms is caused in the substrate, and responsive to such displacement, a negative piezoelectrical charge appears in the region C. Such a negative charge in the region C, which extends into channel region 2, induces a stationary depletion region, particularly in the lower part of the channel region 2, as a result of the expulsion of carrier electrons. Thus, the effective channel thickness is decreased and the operational speed of the transistor is increased. Accordingly, the prior art MESFET device of FIG. 1 can use such piezoelectrical charge to increase the operational speed of the transistor.

On the other hand, when the size of the transistor is reduced for further improvement of the operational speed, the distance between the outer edges 7b of the passivation film 7 and the gate electrode 3 is decreased and the contribution of the tensile stresses T' to the stress field in the region C is correspondingly increased. As a result, a state is created in which tensile stresses become predominant in the region C when the size of the MESFET is made excessively small. In such a state, a positive piezoelectrical charge appears in region C and the depletion region no longer exists. Thus, such miniaturization tends to decrease rather than increase the operational speed of the transistor. A more detailed description of the piezoelectric effect in group III-V compound semiconductor crystals can be found in a paper by Booyens et al. (Booyens, H., Vermaak, J. S., Proto, G. R., "DISLOCATIONS AND THE PIEZOELECTRIC EFFECT IN III-V CRYSTALS", J. Appl. Phys. Vol. 48, No. 7, July 1977).

FIG. 2(B) illustrates a case in which silicon oxide is used as the passivation film 7. In FIG. 2(B), parts which correspond with parts in FIG. 2(A) are given identical reference numerals and description thereof will be omitted. It is assumed in this case also that the gate electrode 3 extends in the $<0\bar{1}1>$ direction on the (100) surface of the gallium arsenide substrate 1 similarly to the case of the transistor of FIG. 2(A).

In the transistor of FIG. 2(B), the silicon oxide passivation film 7 experiences tensile stresses. In other words, the substrate 1 experiences compressive stresses in source region 5 and in drain region 6 and stress components $T_0$ are created at the inner edges 7a of the passivation film 7 to act as tensile stresses in channel region 2 and stress components $T_0'$ are created at the outer edges 7b of the passivation film 7 to act as compressional stresses at the channel region 2. Further, tensile stress components t are induced similarly to the case of FIG. 2(A) between the gate electrode 3 and the substrate 1. Thus, large tensile stress components $\Delta T'$ appear in the region C as the sum of the stress components $T_0$ and t, and the stress components $\Delta T'$ act in an opposite sense relative to the stress components $\Delta T$ of FIG. 2(A). In other words, the stress components $\Delta T'$ act to deteriorate the operational speed of the transistor.

In this case, the compressional stress components $T_0'$ at the outer edges 7b of the passivation film compensate the tensile stress components $\Delta T'$ to some extent, particularly when the size of the transistor has been decreased. However, the effect of the tensile stress components $\Delta T'$ in the region C is generally much larger than the effect of the compressional stress components $T_0'$ and therefore an undesirable decrease in the operational speed of the transistor cannot be avoided.

SUMMARY OF THE INVENTION

It is a general object of the present invention to provide a novel and useful compound semiconductor MESFET device wherein the aforementioned problems are eliminated.

Another and more specific object of the present invention is to provide a compound semiconductor MESFET device having a reduced size and high operational speed.

Another object of the present invention is to provide a compound semiconductor MESFET device comprising a substrate of a group III-V compound semiconductor crystal wherein source, channel and drain regions are defined such that the source and drain regions are located on opposite sides of the channel region. A gate electrode is provided on the substrate in correspondence to the channel region so as to extend in a predetermined elongating direction defined with respect to the crystal orientation of the substrate. A source electrode is provided on the substrate in correspondence to the source region with an uncovered region left between the gate electrode and the source electrode and a drain electrode is provided on the substrate in correspondence to the drain region with an uncovered region left between the gate electrode and the drain electrode. A passivation film covers the gate electrode as well as parts of the source and drain regions not covered by the source and drain electrodes. The passivation film has marginal areas, one of which is adjacent the source electrode and the other of which is adjacent the drain electrode. The marginal areas have thicknesses which are different than the thickness of the remainder of the film.

According to the present invention, the stress component which tends to accumulate in the marginal area of the passivation film and induce a piezoelectric charge in the channel region which in turn causes an undesirable decrease or a desirable increase in the operational speed of the MESFET device depending on the elongation direction of the gate electrode and the type of stress accumulated in the passivation film, is effectively suppressed or enhanced. Thus, by properly modifying the thickness of the marginal areas of the passivation film in combination with the material of the passivation film and the elongation direction of the gate electrode, it is possible to reduce adverse stress components that induce a positive piezoelectric charge in the channel region which in turn causes a decrease in the operational speed of the MESFET. At the same time, it is possible to increase desirable stress components that induce a negative piezoelectric charge in the channel region which in turn produces an increase in the operational speed of the MESFET.

Other objects and further features of the present invention will become apparent from the following detailed description when read in conjunction with attached drawings.

DETAILED DESCRIPTION

Figure 1:
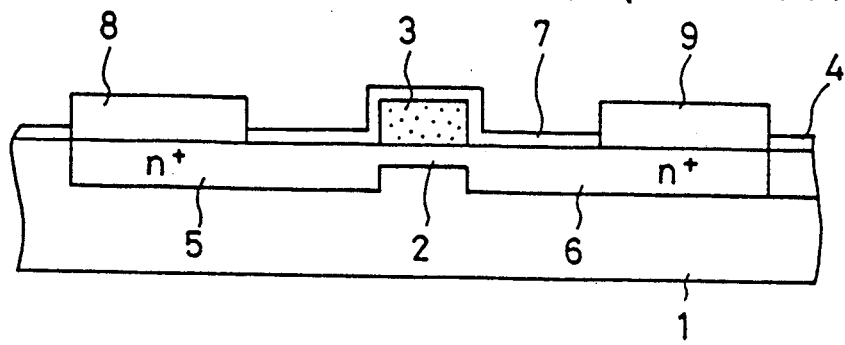
FIG. 1 is a cross-sectional view showing a typical prior art compound semiconductor field effect transistor.
Figure 3:
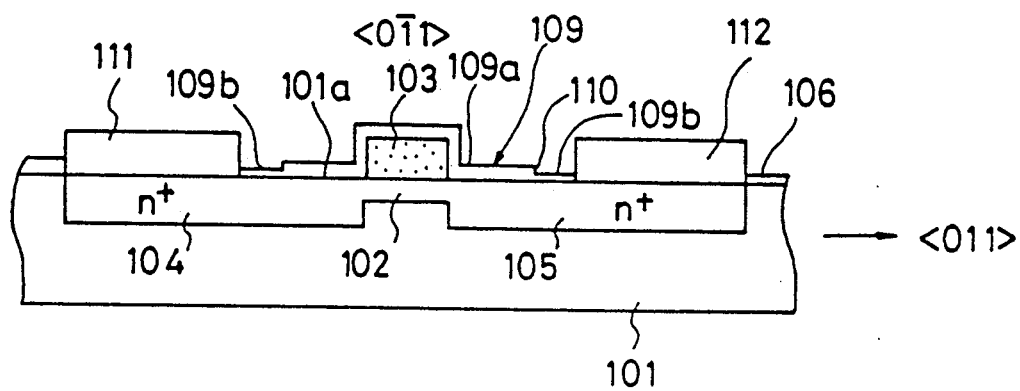
FIG. 3 is a cross-sectional view showing a first embodiment of the compound semiconductor field effect transistor of the present invention.

FIG. 3 shows a first embodiment of the compound semiconductor field effect transistor of the present invention. Referring to FIG. 3, the transistor comprises a semi-insulating GaAs substrate 101 defining a (100) surface 101a, a channel region 102 of the n-type defined in the substrate 101 by implantation of silicon ions (Si*) and elongating in a <011> direction of the GaAs substrate, a gate electrode 103 provided on the substrate 101 in contact therewith in correspondence to the channel region 102, a source region 104 of the n+-type defined in the substrate 101 on one side of the channel region 102, a drain region 105 also of the n+-type defined in the substrate 101, on the other side of the channel region 102, a silicon nitride protective film 106 covering the substrate 101 excluding those areas in which the transistor is formed, a passivation film 109 of silicon nitride covering the gate electrode 103 as well as a part of the source region 104 and a part of the drain region 105 adjacent the gate electrode 103, a source electrode 111 of stacked layers of Au-Ge alloy/Ni/Au and forming an ohmic contact with a part of the source region 104 not covered by the passivation film 109, and a drain electrode 112 also of stacked layers of Au-Ge alloy/Ni/Au and forming an ohmic contact with a part of the drain region 105 not covered by the passivation film 109. The gate electrode 103 extends in a <0$\bar{1}$1> direction of the GaAs substrate 101 in correspondence to the channel region 102. Thus, the general construction of the transistor is similar to that of the prior art transistor shown in FIG. 1. As already noted with reference to the prior art device, the silicon nitride passivation film 109 experiences compressional stresses during operation because of the difference between the temperature at which the device is fabricated and the temperature at which the device is used. The gate electrode 103 is made of a refractory metal silicide such as $WSi_x$ (X=0.6), tungsten nitride $WN_x$, tungsten W, or the like. Gate electrodes made of these materials make a Schottky contact with the substrate 101.

The transistor of the present embodiment, however, has a feature which distinguishes it over the prior art device in that the passivation film 109 has inner areas 109a which are adjacent gate electrode 103 and marginal areas 109b of reduced thickness. The areas 109b of the passivation film 109 are in contact with the source electrode 111 or the drain electrode 112. In the present embodiment, the marginal areas 109b are defined by stepped parts 110.

Figure 2A:
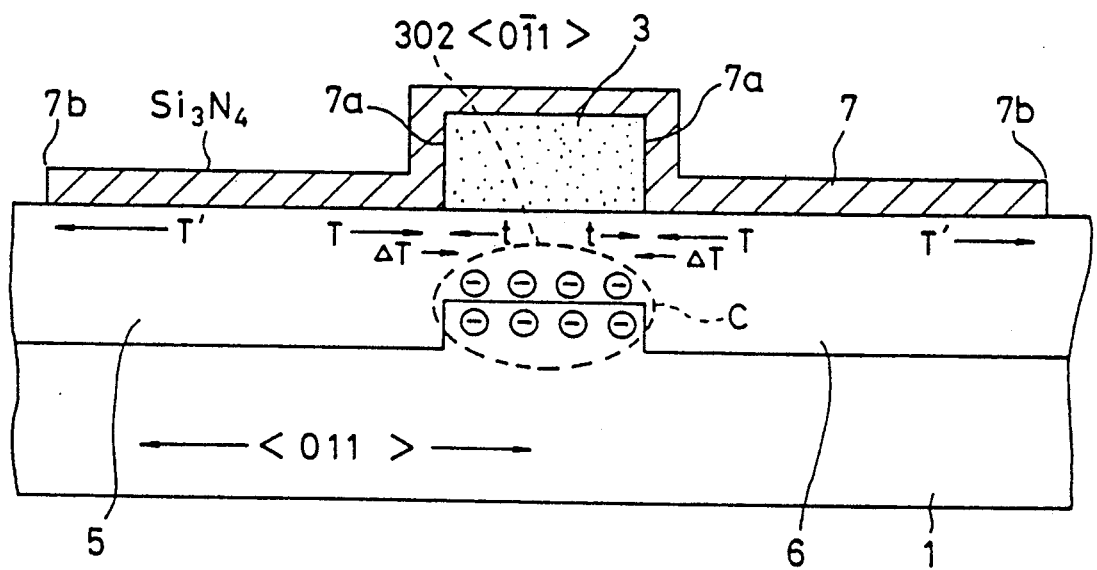
FIG. 2(A) is a cross-sectional view showing a stress field developed in the transistor of FIG. 1 in a case in which silicon nitride is used as the passivation film of the transistor.
Figure 4:
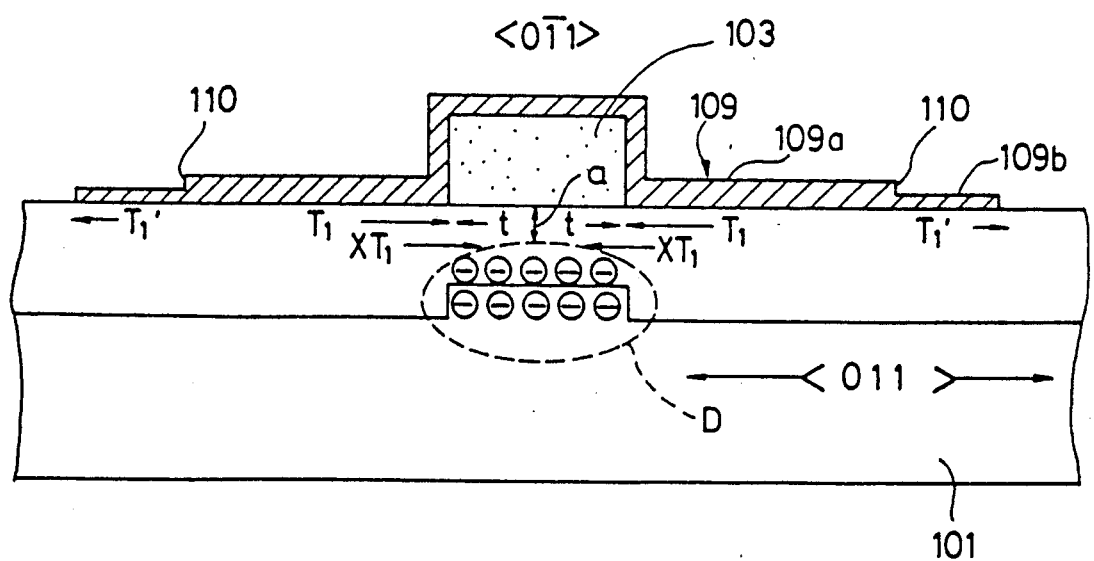
FIG. 4 is a cross-sectional view showing a stress field developed in the transistor of FIG. 3.

The stress field and the piezoelectrical charge induced in the device of FIG. 3 is explained with reference to FIG. 4. By reducing the thickness of the passivation film 109 at the marginal areas 109b, the edge forces applied to the substrate 101 at the marginal areas by the compressional stresses accumulated in the passivation film 109 are reduced and the tensile stresses $T_1'$ corresponding to the stresses T' of FIG. 2(A) are substantially reduced as shown in FIG. 4 which illustrates the distribution of the stresses in the case of the device of FIG. 3. As a result, the contribution of the tensile stress components stemming from stresses $T_1'$ to the stress field under the gate electrode 103 is significantly reduced. In other words, compressional stresses acting in a <011> direction predominate in the region D disposed slightly below the gate electrode 103 and extending into the lower part of the channel region 102, and a negative piezoelectric charge is thus induced in the region D. Responsive thereto, the effective channel thickness is reduced because of the negative charge formed in the channel region 102. More specifically, such a negative charge results in an expulsion of electrons from the channel region 102 to form a stationary depletion region under gate electrode 103. Such a depletion region limits the channel thickness a and thereby the K-factor of the MESFET device whereby the operational speed of the device is increased. Thus, according to the present invention, the size of the compound MESFET device can be reduced without a corresponding decrease in operational speed. In other words, the operational speed of the MESFET device can be increased by miniaturization of the device without corresponding induction of a positive piezoelectric charge in the region under the gate electrode which would cause an undesirable decrease of the operational speed.

Figure 5A:
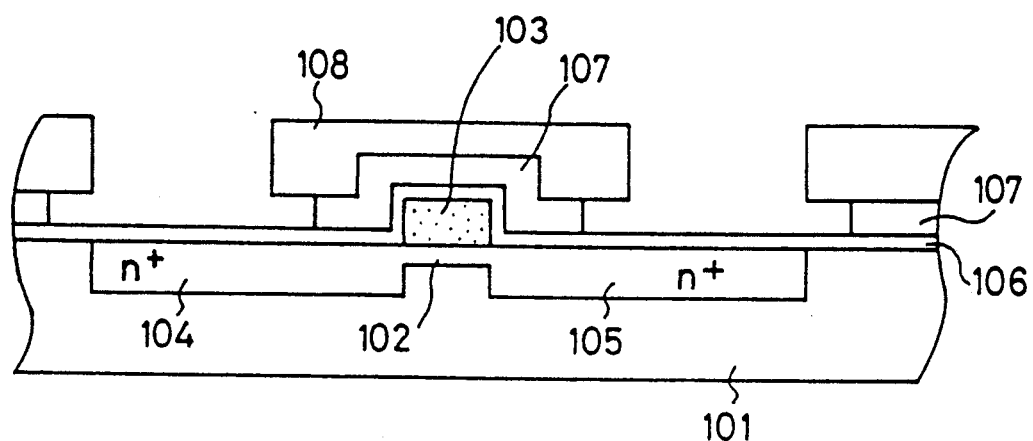
FIGS. 5(A)–(C) are diagrams showing various steps for manufacturing the device of FIG. 3.
Figure 5B:
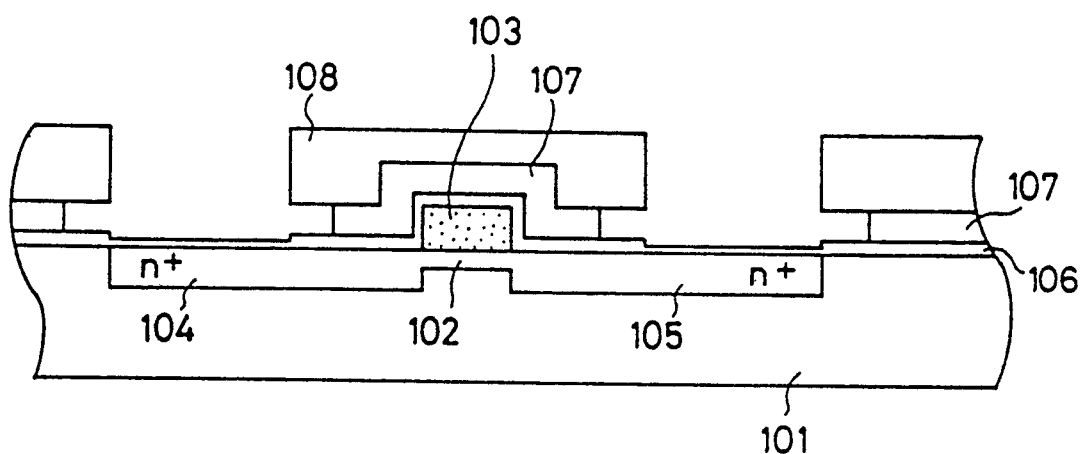
Figure 5C:
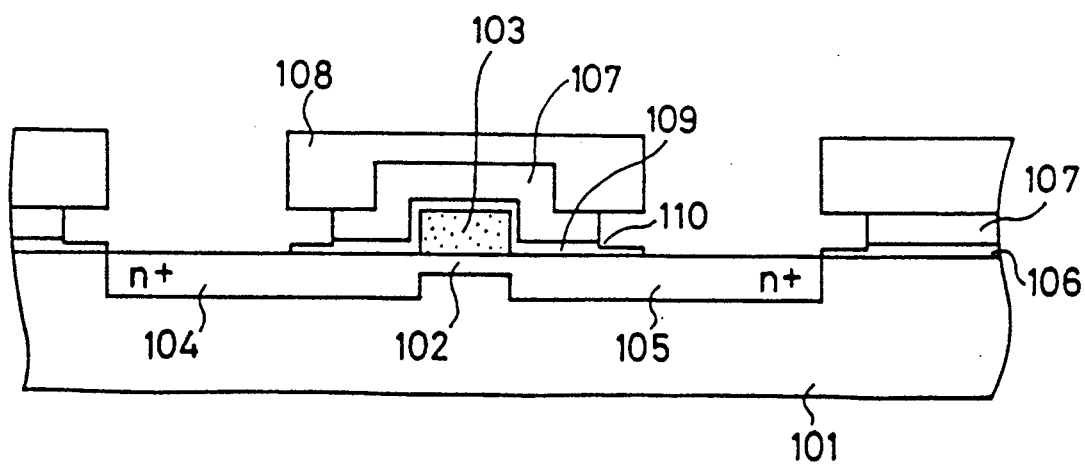

FIG. 5(A)–(C) show steps for manufacturing the structure of FIG. 3. Referring to FIG. 5(A), the semi-insulting GaAs substrate 101 is subjected to implantation with silicon (Si*) ions under an acceleration voltage of 30 keV with a dose of $2.5 \times 10^{12}$ cm$^{-2}$, whereby the channel region 102 is formed. Next, a tungsten silicide film is sputtered to cover the substrate 101 uniformly to a thickness of about 4500 Å, and after patterning by dry etching, the gate electrode 103 having a gate length of 1 μm is formed. Next, the substrate 101 is again subjected to implantation with Si+ ions under an acceleration voltage of 60 keV with a dose of $2 \times 10^{13}$ cm$^{-2}$ while using the gate electrode 103 as a mask. Thus, the n+-type doped source region 104 and the n+-type doped drain region 105 are each formed in alignment with the gate electrode 103. The silicon nitride protective film 106 is then deposited by plasma CVD so as to cover the entire structure to a thickness of about 1000 Å, and a silicon oxide film 107 is deposited on film 106 to a thickness of about 5000 Å. A photoresist 108 is deposited on silicon oxide film 107 and after photolithographic patterning, parts of the silicon oxide film corresponding to the source region 104 and the drain region 105 are removed by wet etching using diluted hydrofluoric acid. Thus, a structure as shown in FIG. 5(A) is obtained.

The structure of FIG. 5(A) is subjected to plasma etching using a mixture of carbon tetrafluoride (CF$_4$) and oxygen at a 20:1 ratio and electrical power of 200 watts under a pressure of 0.05 Torr, whereby the silicon nitride film 106 is etched anisotropically and a structure as shown in FIG. 5(B) is obtained in which the thickness of the silicon nitride film 106 is selectively reduced at the exposed part by a predetermined amount so that it is thinner than the region of the substrate on which the source electrode or drain electrode is to be provided.

The structure of FIG. 5(B) is next subjected once again to plasma etching under conditions which produce isotropic etching. For example, the etching may be performed using the same gas mixture as defined above with a power of 100 watts and a pressure of 0.1 Torr. With this, the silicon nitride film 106 remaining on structure of FIG. 5(B) is uniformly removed until the parts of the silicon nitride film 106 having the reduced thickness are eliminated. As a result, a structure as shown in FIG. 5(C) is obtained in which the passivation film 109 is separated from the silicon nitride film 106 and the steps 110 are formed in the passivation film 109 at the boundaries between parts which have been subjected to isotropic plasma etching and parts which were protected by the silicon oxide film 107 during the isotropic plasma etching.

Either before or after the removal of the photoresist 108 and the silicon oxide film 107, the source electrode 111 and the drain electrode 112 may be provided according to a well known procedure with a thickness of about 4000 Å, and the structure of FIG. 3 is thus obtained. In the illustrated example, the lateral thickness of the passivation film 109 at the sides of the gate electrode 103 is 2000 Å, the thickness of the marginal areas 109b of the passivation film is 300 Å, and the thickness of inner areas 109a of the passivation film 109 adjacent the gate electrode 103 is 1000 Å. Further, the separation between the gate electrode 103 and the source electrode 111 and the separation between the gate electrode 103 and the drain electrode 112 are each set at 1 μm. It was found that the MESFET thus obtained has a threshold voltage $V_{th}$ equal to zero and an $n_g$-value of 0.5 representing the leak current passing through the substrate. This is a significant improvement over prior art devices in which the $n_g$-value was 5 and the $V_{th}$ was −0.4 volts.

Figure 6:
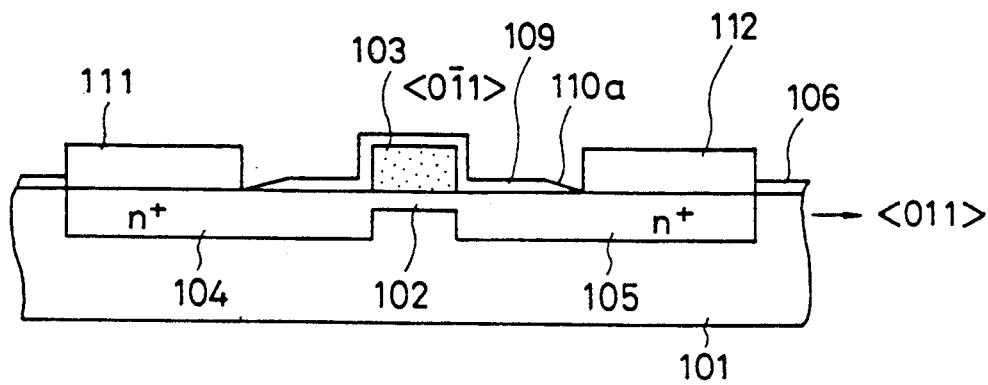
FIG. 6 is a cross-sectional view similar to FIG. 3 showing a modification of the transistor of FIG. 3.

FIG. 6 shows a modification of the MESFET device of FIG. 3. In FIG. 6, parts having an identical construction with corresponding parts of the structure of FIG. 3 are given identical reference numerals and description thereof will be omitted.

Referring to FIG. 6, the marginal areas of the silicon nitride passivation film 109 are thinned out gradually to present slopes 110a. Such slopes may be formed by setting the etching conditions during the etching step of FIG. 5(B) for reducing the thickness of the marginal area such that the etching is conducted isotropically to some extent. In one example, the etching conditions may be set such that the ratio of carbon tetrafluoride gas to oxygen gas is 20:1, the electrical power is 150 watts, and the pressure is 0.07 Torr. The thinned out marginal areas thus produce a similar effect to reduce the tensile stresses applied to the substrate 101 and the tensile stress components acting in the region D are substantially reduced even when the size of the transistor is reduced. Thus, the formation of an undesirable positive piezoelectric charge in the channel region below the gate electrode may be suppressed and the operational speed of the device may be improved similarly to the case of the device of FIG. 3.

Figure 7:
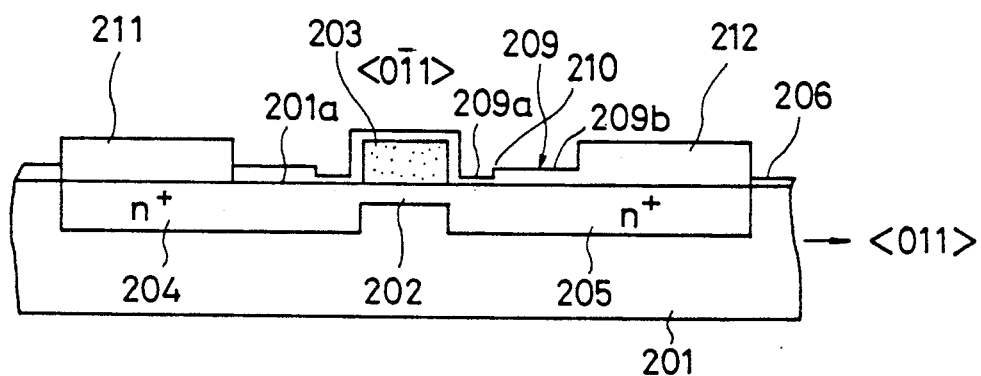
FIG. 7 is a cross-sectional view similar to FIG. 3 showing a second embodiment of the compound semiconductor field effect transistor of the present invention.

FIG. 7 shows a second embodiment of the compound semiconductor field effect transistor device of the present invention. Referring to FIG. 7, the transistor comprises a semi-insulating GaAs substrate 201 defining a (100) surface 201a, a channel region 202 of the n-type defined in the substrate 201 by implantation of silicon ions (Si*) and which extends in the <011> direction, a gate electrode 203 of $WSi_x$ (x=0.6) or the like provided on the substrate 201 in contact therewith in correspondence to the channel region 202, a source region 204 of the n+-type defined in the substrate 201 on one side of the channel region 202, a drain region 205 also of the n+-type defined in the substrate 201 on the other side of the channel region 202, a silicon oxide ($SiO_2$) protective film 206 covering the substrate 201 excluding those areas in which the transistor is formed, a passivation film 209 of silicon oxide covering the gate electrode 203 as well as parts of the source region 204 and of the drain region 205 which are adjacent the gate electrode 203, a source electrode 211 of stacked layers of Au-Ge alloy/Ni/Au forming an ohmic contact with a part of the source region 204 not covered by the passivation film 209, and a drain electrode 212 also of stacked layers of Au-Ge alloy/Ni/Au forming an ohmic contact with a part of the source region 205 not covered by the passivation film 209. Further, the gate electrode 203 extends in the <0$\bar{1}$1> direction with respect to the GaAs substrate 201 in correspondence to the channel region 202 as represented in the drawing. It should be noted that the silicon oxide passivation film 209 experiences tensile stresses during operation because of the difference in the temperature at which the device is formed and the temperature at which the device is used as will be described with reference to FIG. 8.

Silicon oxide passivation film 209 has a greater thickness at marginal areas 209b which are areas of the passivation film 209 in contact with the source electrode 211 or the drain electrode 212 respectively, and a lesser thickness at inner areas 209a in the vicinity of the gate electrode 203. In the present embodiment, the marginal areas 209b are defined by stepped parts 210.

Figure 2B:
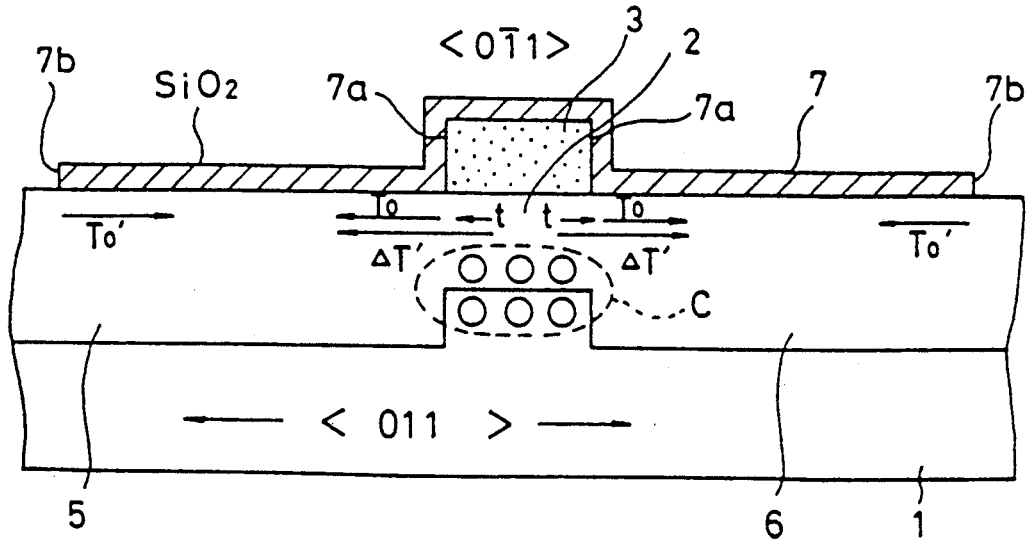
FIG. 2(B) is a cross-sectional view similar to FIG. 2(A) showing the stress field in a case in which silicon oxide is used as the passivation film.
Figure 8:
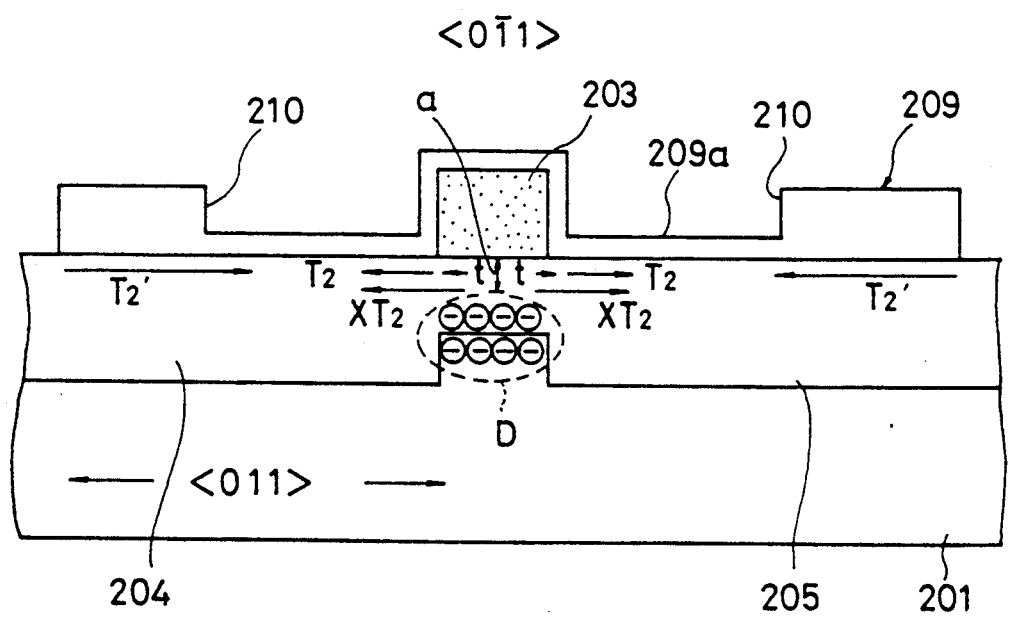
FIG. 8 is a cross-sectional view showing a stress field developed in the substrate of the device of FIG. 7.

As already noted with reference to the prior art device of FIG. 2(B) in which the silicon oxide passivation film covers the gate electrode extending in the <0$\bar{1}$1> direction, a large tensile stress is imposed tending to stretch the substrate in the <0$\bar{1}$1> direction at a region below the gate electrode. Such a tensile stress causes a positive piezoelectric charge in the substrate and deteriorates the operational speed of the device. By increasing the thickness of the passivation film 209 at the marginal areas 209b, the edge forces applied to the substrate 201 at the marginal areas 209b of the passivation film 209 are increased and the compressive stresses $T_2'$ corresponding to the stresses $T_0'$ of FIG. 2(B) are substantially increased as illustrated in FIG. 8 which shows the distribution of the stresses in the case of the device of FIG. 7. Further, by decreasing the thickness of the passivation film 209 at the areas 209a adjacent to gate electrode 203, the edge forces applied to the substrate 201 by tensile stresses $XT_2'$ corresponding to the tensile stresses $\Delta T'$ of FIG. 2(B) are substantially reduced. As a result, the contribution of the compressive stress components imposed by the stresses $T_2'$ on the stress field under the gate electrode 03 is significantly increased. In other words, a compressional stress acting in the <011> direction predominates in the region D slightly below the gate electrode 203 and extends into a lower part of the channel region 202 partially when the size of the MESFET device is decreased, and thus a negative piezoelectric charge is effectively induced in the region D instead of an unwanted positive charge. The effective channel thickness a is thus reduced because the negative charge expels the electrons from the channel region 102 and forms a stationary depletion region under the gate electrode 103. Such a depletion region limits the channel thickness as already described and the K-factor of the MESFET device indicating the operational speed of the device is increased. Thus, according to the present embodiment, the operational speed of the device is increased by the piezoelectric effect associated with the miniaturization of the device in addition to the improvement of the operational speed of the device expected ordinarily by the miniaturization of the device.

Figure 9A:
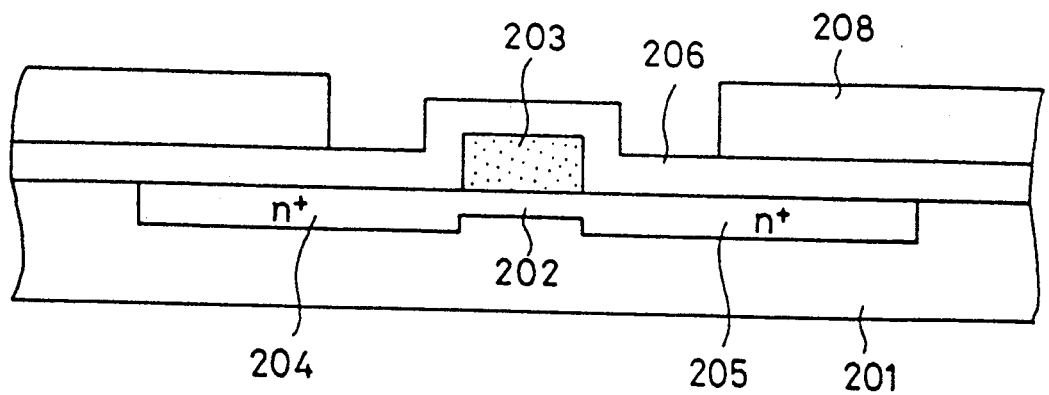
FIGS. 9(A) and (B) are diagrams showing various steps for manufacturing the transistor of FIG. 7.

FIGS. 9(A) and (B) show steps for manufacturing the structure of FIG. 7. Referring to FIG. 9(A), the semi-insulating GaAs substrate 201 is subjected to implantation with silicon ions (Si*) under an acceleration voltage of 30 keV with a dose of $2.5 \times 10^{12}$ cm$^{-2}$, whereby the channel region 202 is formed. Next, a tungsten silicide film is sputtered to cover the substrate 201 uniformly to a thickness of about 4500 Å, and after patterning by dry etching, gate electrode 203 having a gate length of 1 μm is formed. Next, substrate 201 is again subjected to implantation with Si+ions under an acceleration voltage of 60 keV to a dose of $2 \times 10^{13}$ cm$^{-2}$ while using the gate electrode 203 as a mask. The source region 204 and the drain region 205, both doped to the n+-type, are then formed in alignment with the gate electrode 203. A silicon oxide film 206 is then deposited to a thickness of about 5000 Å. Next, a photoresist 208 is deposited on the silicon oxide film 206 and after photolithographic patterning for exposing parts of the silicon oxide film 206 corresponding to the regions 209a as shown in FIG. 9(A), the silicon oxide film 206 is etched away using dilute hydrofluoric acid.

Figure 9B:
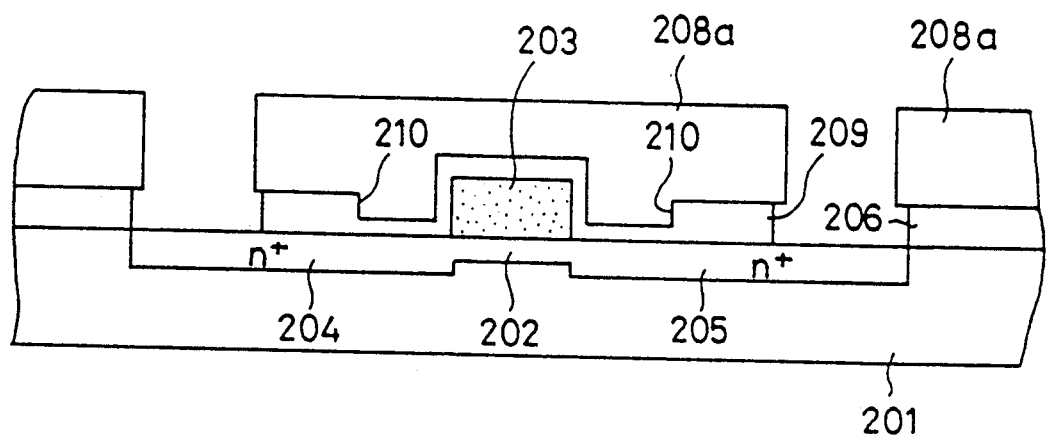

The photoresist 208 is removed and the structure thus obtained is covered by another photoresist 208a exposing the regions of the silicon oxide film 206 corresponding to the source electrode 211 and the drain electrode 212. After plasma etching, the structure shown in FIG. 9(B) is obtained in which the passivation film 209 is separated from the silicon oxide film 206 and from this, the structure of FIG. 7 is obtained by removing the photoresist 208a and depositing the source electrode 211 and the drain electrode 212 according to a well known procedure to a thickness of about 4000 Å. In the illustrated example, the passivation film has a lateral thickness of 2000 Å at the side of the gate electrode 203 and a thickness of 300 Å at the regions 209a adjacent the gate electrode 203, while the thickness of the passivation film 209 at the marginal areas 209b is set at 1000 Å. Further, the separation between the gate electrode 203 and the source electrode 211 and the separation between the gate electrode 230 and the drain electrode 212 are each set at 1 μm similarly to the first embodiment. In this embodiment also, a similar improvement of the operational speed of the MESFET device is achieved by the negative piezoelectric charge induced under the gate electrode 203. Further, an improved threshold voltage as well as an improvement in the $n_g$-factor similar to the improvements of the first embodiment are obtained.

Figure 10:
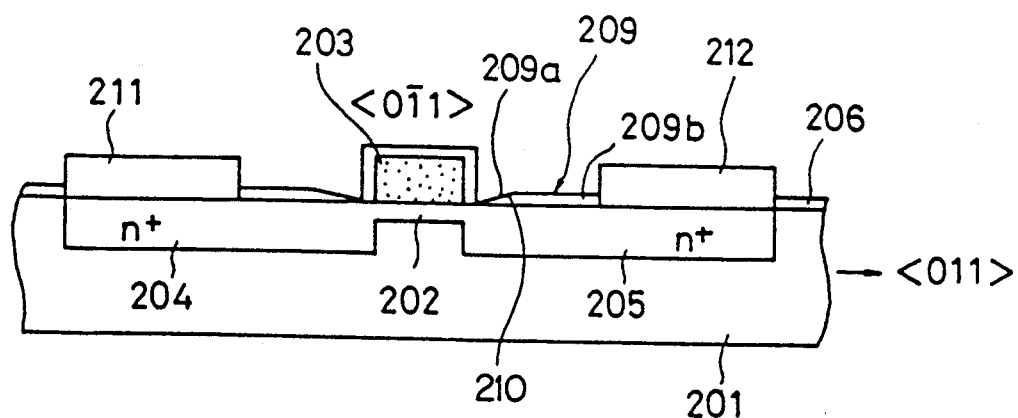
FIG. 10 is a cross-sectional view showing a modification of the transistor of FIG. 7.

FIG. 10 shows a modification of the MESFET device of FIG. 7. In FIG. 10, the parts having an identical construction to those parts in FIG. 7 are given identical reference numerals and the description thereof will be omitted.

Figure 11:
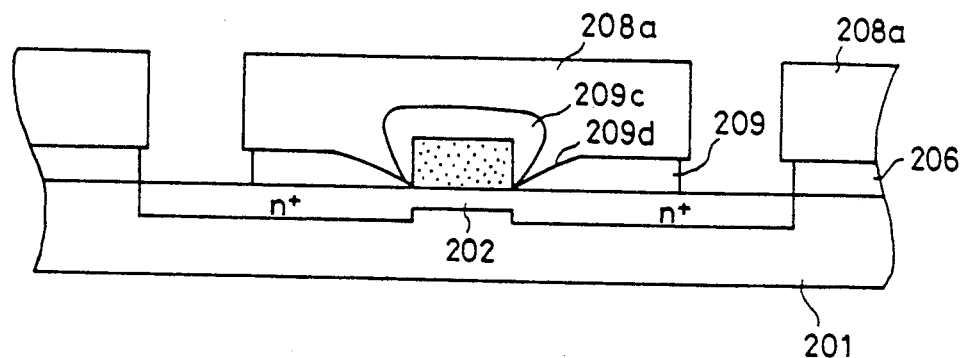
FIG. 11 is a cross-sectional view showing a manufacturing step for the device of FIG. 10.

Referring to FIG. 10, the inner areas 209a of the silicon oxide passivation film 209 are thinned out gradually to present slopes 210a declining toward the gate electrode 203. Such slopes may be formed at the time of depositing the silicon oxide film 206 by using an atmospheric pressure CVD method which deposits the silicon oxide according to a supply-limited kinetic process. FIG. 11 shows such a silicon oxide passivation film 209 formed as a result of deposition of silicon oxide on the substrate 201 as well as on the gate electrode 203 by atmospheric pressure CVD. The passivation film 209 and the protective film 206 are already separated in FIG. 11 by etching corresponding to the source electrode 211 and the drain electrode 212. It can be seen that overhangs 209c of silicon oxide are formed on the gate electrode 203 and in correspondence thereto, slopes 209d declining toward the gate electrode 203 in the passivation film 209 are formed on the substrate 201. The construction of the structure of FIG. 11 from the structure of FIG. 10 is straightforward and the description thereof will be omitted. It is obvious that th modification of FIG. 10 also provides an improved operational speed as a result of the negative piezoelectric charge induced under the gate electrode 203.

Figure 12:
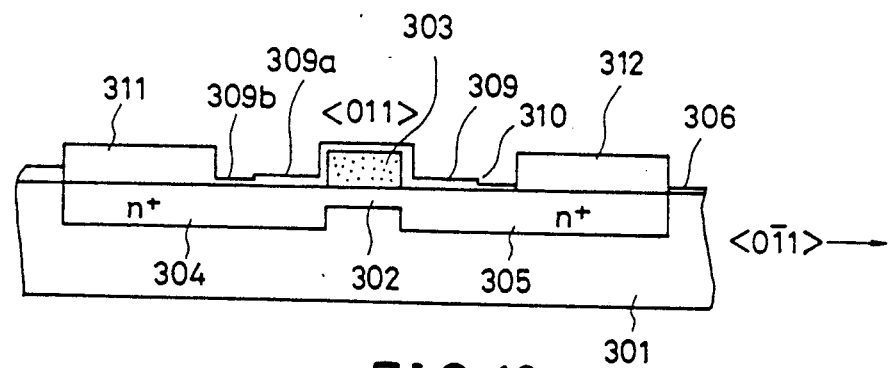
FIG. 12 is a cross-sectional view showing a third embodiment of the MESFET device of the present invention.

A third embodiment of the MESFET device of the present invention will be described with reference to FIG. 12. Referring to FIG. 12, the device comprises a semi-insulating GaAs substrate 301 in which an n-type channel region 302 is defined so as to extend in the $<0\bar{1}1>$ direction of the gallium arsenide substrate. Further, an n+-type source region 304 and an n+-type drain region 305 are defined in the substrate 301 at respective opposite sides of the channel region 302. On the substrate 301 corresponding to the channel region 302, a gate electrode 303 is provided along the $<011>$ direction which is perpendicular to the direction $<0\bar{1}1>$ in which the gate electrode 103 or 203 of the previous embodiments extends. Further, a gate electrode 311 and a drain electrode 312 are provided in correspondence to the source region 304 and the drain region 305 at positions spaced relatively away from the gate electrode 303, and the parts of the source region and the drain region not covered by the source electrode 311 or the drain electrode 312 are covered by a silicon oxide passivation film 309. In this embodiment, the passivation film 309 is divided into inner areas 309a and marginal areas 309b by stepped parts 310 wherein the marginal areas 309b have a reduced thickness relative to inner areas 309a. The procedure of manufacturing the device of the present embodiment will be omitted as such a procedure would be apparent to those skilled in the art from the previous description for manufacturing the device FIG. 3.

Figure 13:
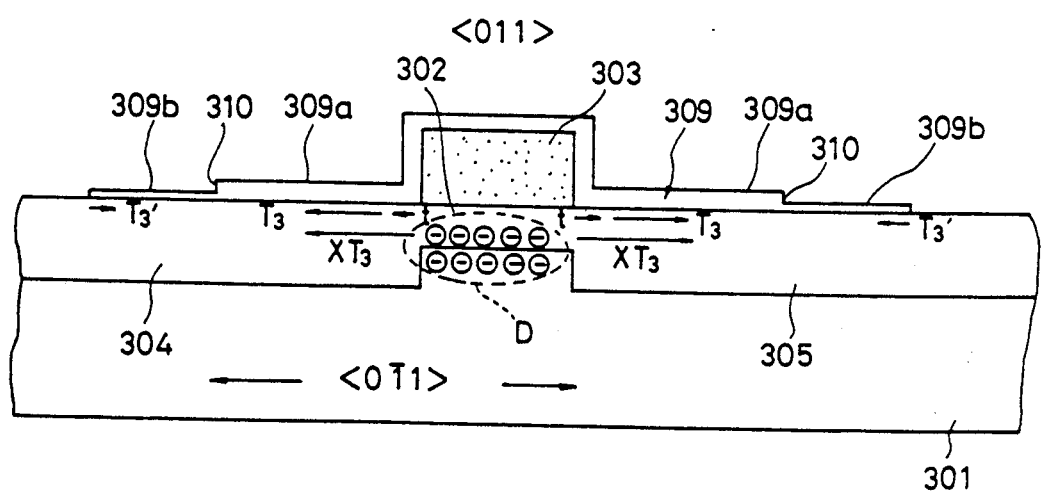
FIG. 13 is a cross-sectional view showing a stress field developed in the device of FIG. 12.

FIG. 13 shows the stress field produced in the substrate 301 of the device of FIG. 12. As the passivation film 309 is made of silicon oxide, the passivation film experiences tensile stresses during operation because of the difference between the temperature at which the device is fabricated and the temperature at which the device is used. Responsive thereto, the source region 304 and the drain region 305 experience compressive stresses and the channel region 302 located between the source region 304 and the drain region 305 is subjected to a large tensile stress $T_3$ acting in a direction to stretch the channel region 302. Further, the gate electrode 303 itself causes the tensile stress t as already described. On the other hand, the stresses $T_3'$ at the marginal areas 309b acting on the channel region 302 as a compressive stress has only a small magnitude because of the reduced thickness of the marginal areas 309b. Thus, large tensile stress components $XT_3$ appear in a region D of the substrate 301 slightly below the gate electrode 303. As the gate electrode 303 extends in the $<011>$ direction, these tensile stress components $XT_3$ act in a $<0\bar{1}1>$ direction of the substrate which is perpendicular to the direction in which the stress components XT or XT' of the previous embodiment acted. The tensile stresses applied to the GaAs substrate 301 in the $<0\bar{1}1>$ direction induce a negative piezoelectric charge contrary to the previous embodiments and the operational speed of the MESFET is improved as a result of the limiting of the effective thickness of channel a.

A fourth embodiment of the MESFET device of the present invention is described with reference to FIG. 14. The device comprises a semi-insulating GaAs substrate 401 defined with an n-type channel region 402 extending in the $<0\bar{1}1>$ direction of the substrate. Further, a source region 404 and a drain region 405, both doped to the n+-type, are defined at respective opposite sides of the channel region 402 similarly to the device of FIG. 12 and a gate electrode 403 is provided on the substrate 401 in correspondence to the channel region 402. Thus, the gate electrode 403 extends in the $<011>$ direction similarly to the gate electrode 303.

The source region 404 and the drain region 405 are provided with respective electrodes 411 and 412 making ohmic contact therewith at regions spaced away from the gate electrode 403 presenting exposed regions in the vicinity of the gate electrode 403. These exposed regions are covered by a silicon nitride passivation film 409 which is divided by stepped parts 410 into first parts 409a having a reduced thickness in the vicinity of the gate electrode 403 and second parts 409b having an increased thickness in the vicinity of the source or drain electrodes 411, 412. A protective film 406 is provided to protect otherwise uncovered portions of substrate 401. The procedure for manufacturing the device of the present embodiment will be omitted as such a procedure would be apparent to those skilled in the art from the previous description for constructing the device of FIG. 7.

Figure 15:
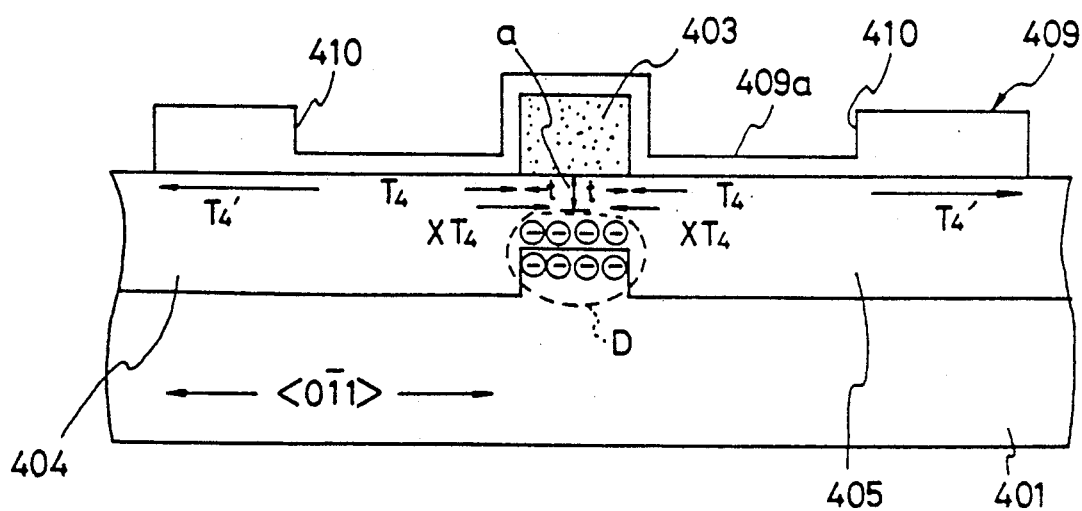
FIG. 15 is a cross-sectional view showing a stress field developed in the device of FIG. 14.

The silicon nitride passivation film 409 provided as such experiences a compressional stress during operation similar to the silicon nitride passivation films of the previous embodiments. This produces tensile stresses $T_4$ and $T_4'$ acting to stretch the source region 404 or the drain region 405 as shown in FIG. 15. The passivation film is thin at parts 409a in the vicinity of the gate electrode 403, and accordingly the tensile stresses $T_4$ acting under parts 409a is much smaller than the tensile stresses $T_4'$ acting under parts 409b which have a relatively greater thickness. Thus, the predominant stress field occurring in a region D slightly below the gate electrode 403 is tensile, particularly when the size of the MESFET device is decreased, even when the stress components t causes by the gate electrode 403 are taken into consideration. Such tensile stresses act in the $<0\bar{1}1>$ direction of the GaAs substrate, and therefore a negative piezoelectric charge is induced in the region D and the effective channel thickness a of the device is effectively limited. As a result, an increased operational speed for the device is facilitated similarly to the case of the second embodiment by a decrease in the size of the device in addition to the improvement of the operational speed ordinarily expected by such a miniaturization.

In the above description, it has been assumed that the substrate comprises GaAs which is a typical group III-V compound semiconductor material. However, the substrate is not limited to GaAs since any other group III-V semiconductor material, such as InP, having a zinc blend structure may be used, because a similar piezoelectric effect occurs in such materials.

Figure 14:
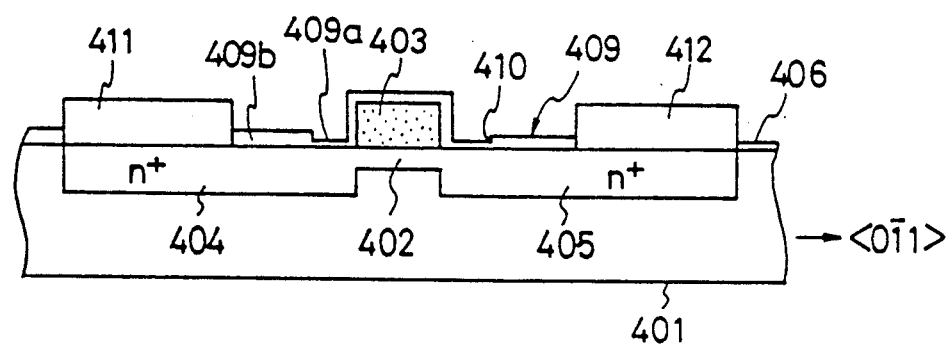
FIG. 14 is a cross-sectional view showing a fourth embodiment of the MESFET device of the present invention.

Further, the devices of FIG. 12 or 14 may be modified similarly to the devices of FIG. 6 or FIG. 10 by gradually thinning out the marginal areas 309b or the inner areas 409a. Such modification would be obvious to those skilled in the art from the preceding description for the manufacture of the structures of FIG. 6 and FIG. 10, and further description will be omitted.

Further, the present invention is not limited to the embodiments and modifications specifically described above but various variations and modifications may be made without departing from the scope of the invention.

What is claimed is:

1. A metal-semiconductor field effect transistor, comprising:
   a substrate of a group III-V compound semiconductor material having a zinc blend structure;
   a gate electrode provided on the substrate so as to extend in a $<0\bar{1}1>$ direction of the substrate;
   a channel region defined in the substrate in alignment with the gate electrode and extending in a $<011>$ direction of the substrate;
   a source region defined in the substrate at one side of the channel region;
   a drain region defined in the substrate at the other side of the channel region;
   a source electrode provided on the substrate so as to cover a first part of the source region spaced from the gate electrode while leaving a second part of the source region adjacent the gate electrode uncovered;
   a drain electrode provided on the substrate so as to cover a first part of the drain region spaced from the gate electrode while leaving a second part of the drain region adjacent the gate electrode uncovered; and
   a passivation film of a material experiencing a compressive stress during operation, said passivation film being provided so as to cover the gate electrode, said second part of the source region and said second part of the drain region, said passivation film comprising an inner area part covering a part of said second part of the source region adjacent the gate electrode and a part of said second part of the drain region adjacent the gate electrode, said film also comprising a marginal area part covering a part of said second part of the source region spaced from the gate electrode and a part of said second part of the drain region spaced from the gate electrode, said marginal area part having a thickness that is substantially less than that of said inner area part.

2. A metal-semiconductor field effect transistor as claimed in claim 1 in which said passivation film comprises silicon nitride.

3. A metal-semiconductor field effect transistor as claimed in claim 1 in which said marginal area part is defined relative to said inner area part by a stepped part across which the thickness of the passivation film changes stepwise.

4. A metal-semiconductor field effect transistor as claimed in claim 1 in which said inner area part of the passivation film has a thickness of about 1000 Å and said marginal area part has a thickness of about 300 Å.

5. A metal-semiconductor field effect transistor as claimed in claim 1 in which the thickness of the marginal area part decreases continuously with increased distance from the gate electrode.

6. A metal-semiconductor field effect transistor, comprising:
   a substrate of a group III-V compound semiconductor material having a zinc blend structure;
   a gate electrode provided on the substrate so as to extend in a $<0\bar{1}1>$ direction of the substrate;
   a channel region defined in the substrate in alignment with the gate electrode and extending in a $<011>$ direction of the substrate;
   a source region defined in the substrate at one side of the channel region;
   a drain region defined in the substrate at the other side of the channel region;
   a source electrode provided on the substrate so as to cover a first part of the source region spaced from the gate electrode while leaving a second part of the source region adjacent the gate electrode uncovered;

a drain electrode provided on the substrate so as to cover a first part of the drain region spaced from the gate electrode while leaving a second part of the drain region adjacent the gate electrode uncovered; and a passivation film of a material experiencing a tensile stress during operation, said passivation film being provided so as to cover the gate electrode, said second part of the source region and said second part of the drain region, said passivation film comprising an inner area part covering a part of said second part of the second region adjacent the gate electrode and a part of said second part of the drain region adjacent the gate electrode, said film also comprising a marginal area part covering a part of said second part of the source region spaced from the gate electrode and a part of said second part of the drain region spaced from the gate electrode, said inner area part having a thickness that is substantially less than that of said marginal area part.

7. A metal-semiconductor field effect transistor as claimed in claim 6 in which said passivation film comprises silicon oxide.

8. A metal-semiconductor field effect transistor as claimed in claim 6 in which said marginal area part is defined relative to said inner area part by a stepped part across which the thickness of the passivation film changes stepwise.

9. A metal-semiconductor field effect transistor as claimed in claim 6 in which said inner area part of the passivation film has a thickness of about 300 Å and said marginal area part of the passivation film has a thickness of about 1000 Å.

10. A metal-semiconductor field effect transistor as claimed in claim 6 in which the thickness of the inner area part increases continuously with increased distance from the gate electrode.

11. A metal-semiconductor field effect transistor, comprising:
a substrate of a group III-V compound semiconductor material having a zinc blend structure;
a gate electrode provided on the substrate so as to extend in a <011> direction of the substrate;
a channel region defined in the substrate in alignment with the gate electrode and extending in a <0$\bar{1}$1> direction of the substrate;
a source region defined in the substrate at one side of the channel region;
a drain region defined in the substrate at the other side of the channel region;
a source electrode provided on the substrate so as to cover a first part of the source region spaced from the gate electrode while leaving a second part of the source region adjacent the gate electrode uncovered;
a drain electrode provided on the substrate so as to cover a first part of the drain region spaced from the gate electrode while leaving a second part of the drain region adjacent the gate electrode uncovered; and a passivation film of a material experiencing a tensile stress during operation, said passivation film being provided so as to cover the gate electrode, said second part of the source region and said second part of the drain region, said passivation film comprising an inner area part covering a part of said second part of the second region adjacent the gate electrode and a part of said second part of the drain region adjacent the gate electrode, said film also having a marginal area part covering a part of said second part of the source region spaced from the gate electrode and a part of said second part of the drain region spaced from the gate electrode, said marginal area part having a thickness that is substantially less than that of said inner area part.

12. A metal-semiconductor field effect transistor, comprising:
a substrate of a group III-V compound semiconductor material having a zinc blend structure;
a gate electrode provided on the substrate so as to extend in a <011> direction of the substrate;
a channel region defined in the substrate in alignment with the gate electrode and extending in a <0$\bar{1}$1> direction of the substrate;
a source region defined in the substrate at one side of the channel region;
a drain region defined in the substrate at the other side of the channel region;
a source electrode provided on the substrate so as to cover a first part of the source region spaced from the gate electrode while leaving a second part of the source region adjacent the gate electrode uncovered;
a drain electrode provided on the substrate so as to cover a first part of the drain region spaced from the gate electrode while leaving a second part of the drain region adjacent the gate electrode uncovered; and
a passivation film of a material experiencing a compressive stress during operation, said passivation film being provided so as to cover the gate electrode, said second part of the source region and said second part of the drain region, said passivation film comprising an inner area part covering a part of said second part of the second region adjacent the gate electrode and a part of said second part of the drain region adjacent the gate electrode, said film also comprising a marginal area part covering a part of said second part of the source region spaced from the gate electrode and a part of said second part of the drain region spaced from the gate electrode, said inner area part having a thickness that is substantially less than that of said marginal area part.

* * * * *

UNITED STATES PATENT AND TRADEMARK OFFICE
CERTIFICATE OF CORRECTION

PATENT NO. : 5,023,676
DATED : June 11, 1991
INVENTOR(S) : SHIGERU TATSUTA

It is certified that error appears in the above-identified patent and that said Letters Patent is hereby corrected as shown below:

Title page, Primary Examiner should be --William Mintel--.

Column 8, line 36, "03" should be --203--;

line 48, after "thickness" insert --a--.

Column 9, line 62, "th" should be --the--.

Signed and Sealed this

First Day of December, 1992

Attest:

DOUGLAS B. COMER

Attesting Officer     Acting Commissioner of Patents and Trademarks